United States Patent
Ghosh et al.

(10) Patent No.: US 10,916,275 B1
(45) Date of Patent: Feb. 9, 2021

(54) WRITE DRIVER AND PRE-CHARGE CIRCUITRY FOR HIGH PERFORMANCE PSEUDO-DUAL PORT (PDP) MEMORIES

(71) Applicant: QUALCOMM Incorporated, San Diego, CA (US)

(72) Inventors: Sonia Ghosh, San Diego, CA (US); Changho Jung, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/735,539

(22) Filed: Jan. 6, 2020

(51) Int. Cl.
*G11C 7/12* (2006.01)
*G11C 8/16* (2006.01)
*G11C 7/08* (2006.01)
*G11C 11/419* (2006.01)

(52) U.S. Cl.
CPC .................. *G11C 7/12* (2013.01); *G11C 7/08* (2013.01); *G11C 8/16* (2013.01); *G11C 11/419* (2013.01)

(58) Field of Classification Search
CPC ......... G11C 7/12; G11C 8/08; G11C 11/4091; G11C 14/0054
See application file for complete search history.

(56) References Cited

U.S. PATENT DOCUMENTS

2006/0077737 A1* 4/2006 Ooishi .................... G11C 11/16
365/203
2016/0042785 A1* 2/2016 Rim ....................... G11C 11/419
365/156

* cited by examiner

*Primary Examiner* — Han Yang
(74) *Attorney, Agent, or Firm* — Seyfarth Shaw LLP

(57) ABSTRACT

A method for operating a pseudo-dual port (PDP) memory is described. The method includes pre-charging bitline pairs BL and BLB coupled to unselected columns of the PDP memory according to a write operation during a pre-charge operation after a read operation of the PDP memory. The method also includes concurrently pulling-down a bitline pair BL and BLB coupled to a selected column of PDP memory according to the write operation.

20 Claims, 12 Drawing Sheets

US 10,916,275 B1

WRITE DRIVER AND PRE-CHARGE CIRCUITRY FOR HIGH PERFORMANCE PSEUDO-DUAL PORT (PDP) MEMORIES

BACKGROUND

Field

The present disclosure generally relates to memory circuits. More specifically, aspects of the present disclosure relate to an improved write driver and pre-charge circuitry for high performance pseudo-dual port memories.

Background

Memory is a vital component for wireless communications devices. For example, a cell phone integrates memory as part of an application processor. Many wireless applications depend on the functionality of a dual port memory (e.g., a memory capable of handling both a read and a write operation within a single clock cycle). A dual port memory includes two ports operating with an array of simultaneously accessible memory cells. That is, a dual port memory may access two different memory locations (e.g., addresses) in a single cycle using the two ports.

Unfortunately, dual port memories consume significant area, which may prohibit their use in wireless communications devices. A pseudo-dual port (PDP) memory may be used in place of the dual port memory to reduce a memory footprint. The core of the PDP memory may be a single-core memory. As a result, the memory array of the PDP memory is limited to a single memory access at one instance, rather than the two simultaneous memory accesses supported by dual port memory. A PDP memory may emulate the two ports provided by dual port memory. For example, a PDP memory may sequentially perform a read operation and then a write operation to emulate the dual port function.

Unfortunately, increased cycle times of PDP memories inhibit meeting the ever-increasing demands for more processing capability. Consequently, one design challenge is improving the performance of PDP memories. For example, reducing the cycle time of PDP memories may increase the use of PDP memory in high performance applications.

SUMMARY

A method for operating a pseudo-dual port (PDP) memory is described. The method includes pre-charging bitline pairs BL and BLB coupled to unselected columns of the PDP memory according to a write operation during a pre-charge operation after a read operation of the PDP memory. The method also includes concurrently pulling-down a bitline pair BL and BLB coupled to a selected column of PDP memory according to the write operation.

A pseudo dual port (PDP) memory is described: The PDP memory includes a sense amplifier coupled to bitline pairs BL and BLB. The PDP memory also includes a bitline pre-charge (BLPC) circuit coupled to the bitline pairs BL and BLB. The PDP memory further includes a read multiplexer coupled to the bitline pairs BL and BLB and between the sense amplifier and the BLPC circuit. The PDP memory also includes a merged pre-charge/write switcher/driver circuit coupled to the bitline pairs BL and BLB. The merged pre-charge/write switcher/driver circuit is configured to pre-charge the bitline pairs BL and BLB coupled to unselected columns of the PDP memory according to a write operation during a pre-charge operation after a read operation of the PDP memory. The merged pre-charge/write switcher/driver circuit is also configured to concurrently pull-down a bitline pair BL and BLB coupled to a selected column of the PDP memory according to the write operation.

A non-transitory computer-readable medium having program code recorded thereon for operating a pseudo-dual port (PDP) memory is described. The program code is executed by a processor. The non-transitory computer-readable medium includes program code to pre-charge bitline pairs BL and BLB coupled to unselected columns of the PDP memory according to a write operation during a pre-charge operation after a read operation of the PDP memory. The non-transitory computer-readable medium also includes program code to concurrently pull-down a bitline pair BL and BLB coupled to a selected column of PDP memory according to the write operation.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily used as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
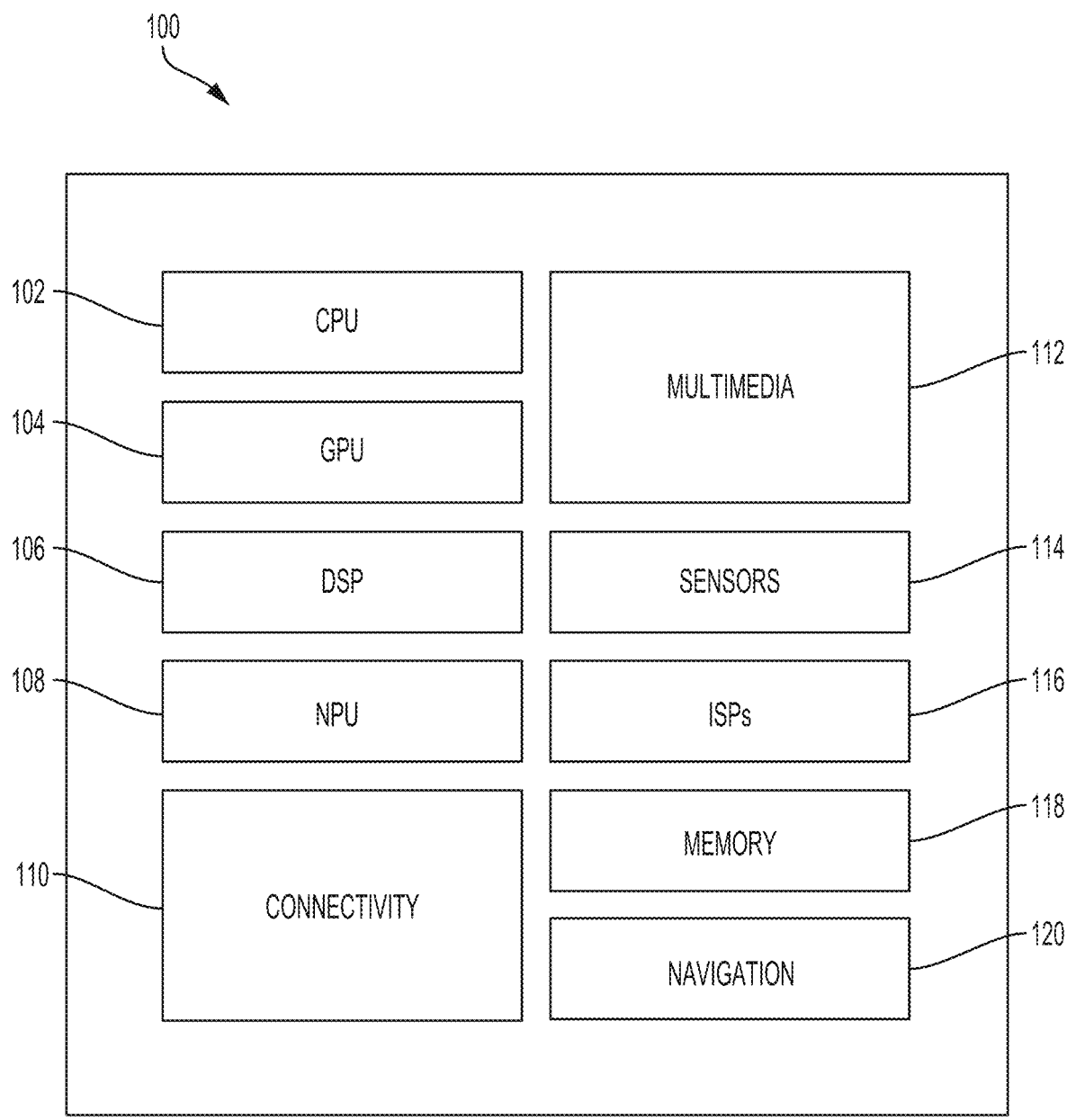
FIG. 1 illustrates an example implementation of a system-on-a-chip (SOC), including a pseudo-dual port (PDP) memory, in accordance with certain aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts.

Based on the teachings, one skilled in the art should appreciate that the scope of the disclosure is intended to cover any aspect of the disclosure, whether implemented independently of or combined with any other aspect of the disclosure. For example, an apparatus may be implemented or a method may be practiced using any number of the aspects set forth. In addition, the scope of the disclosure is intended to cover such an apparatus or method practiced using other structure, functionality, or structure and functionality in addition to or other than the various aspects of the disclosure set forth. It should be understood that any aspect of the disclosure disclosed may be embodied by one or more elements of a claim.

As described herein, the use of the term "and/or" is intended to represent an "inclusive OR", and the use of the term "or" is intended to represent an "exclusive OR". The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different technologies, system configurations, networks and protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

Dual port memories consume significant space, which may prohibit their use in high performance applications of wireless communications devices. A pseudo-dual port (PDP) memory may replace a dual port memory to reduce a memory footprint. The core of the PDP memory may be a single-core memory. As a result, the memory array of the PDP memory is limited to a single memory access at one instance, rather than the two simultaneous memory accesses supported by dual port memory. A PDP memory may emulate the two ports provided by dual port memory. For example, a PDP memory may sequentially perform a read operation and then a write operation to emulate the dual port function.

Unfortunately, increased cycle times of PDP memories inhibit meeting the ever-increasing demands for more processing capability in wireless communications devices. Consequently, one design challenge is improving the performance of PDP memories. For example, reducing the cycle time of PDP memories may increase the use of PDP memory in high performance applications of wireless communications devices. Aspects of the present disclosure are directed to an improved write driver and pre-charge circuitry for high performance pseudo-dual port memories.

Various aspects of a memory are presented in the context of a static random access memory (SRAM) configured as a PDP memory. SRAM is volatile memory that consumes power to retain data. Nevertheless, as those skilled in the art will readily appreciate, such aspects may be extended to other memories and/or circuit configurations. Accordingly, references to the SRAM and the PDP memory are intended only to illustrate aspects of the memory with the understanding that such aspects may be extended to a wide range of applications.

FIG. 1 illustrates an example implementation of a host system-on-a-chip (SOC) 100, which includes a memory 118, which is configured as a PDP memory having an improved write driver and pre-charge circuitry to support high performance applications, in accordance with aspects of the present disclosure. The host SOC 100 includes processing blocks tailored to specific functions, such as a connectivity block 110. The connectivity block 110 may include fifth generation (5G) connectivity, fourth generation long term evolution (4G LTE) connectivity, Wi-Fi connectivity, USB connectivity, Bluetooth connectivity, Secure Digital (SD) connectivity, and the like.

In this configuration, the host SOC 100 includes various processing units that support multi-threaded operation. For the configuration shown in FIG. 1, the host SOC 100 includes a multi-core central processing unit (CPU) 102, a graphics processor unit (GPU) 104, a digital signal processor (DSP) 106, and a neural processor unit (NPU) 108. The host SOC 100 may also include a sensor processor 114, image signal processors (ISPs) 116, a navigation module 120, which may include a global positioning system, and a memory 118. The multi-core CPU 102, the GPU 104, the DSP 106, the NPU 108, and the multi-media engine 112 support various functions such as video, audio, graphics, gaming, artificial networks, and the like. Each processor core of the multi-core CPU 102 may be a reduced instruction set computing (RISC) machine, an advance RISC machine (ARM), a microprocessor, or some other type of processor. The NPU 108 may be based on an ARM instruction set.

In an aspect of the present disclosure, the instructions loaded into the multi-core CPU 102 may include program code to pre-charging bitline pairs BL and BLB coupled to unselected columns of the pseudo-dual port (PDP) memory according to a write operation during a pre-charge operation after a read operation of the PDP memory. The instructions loaded into the multi-core CPU 102 may also include program code to concurrently pulling-down a bitline pair BL and BLB coupled to a selected column of PDP memory according to the write operation.

Figure 2:
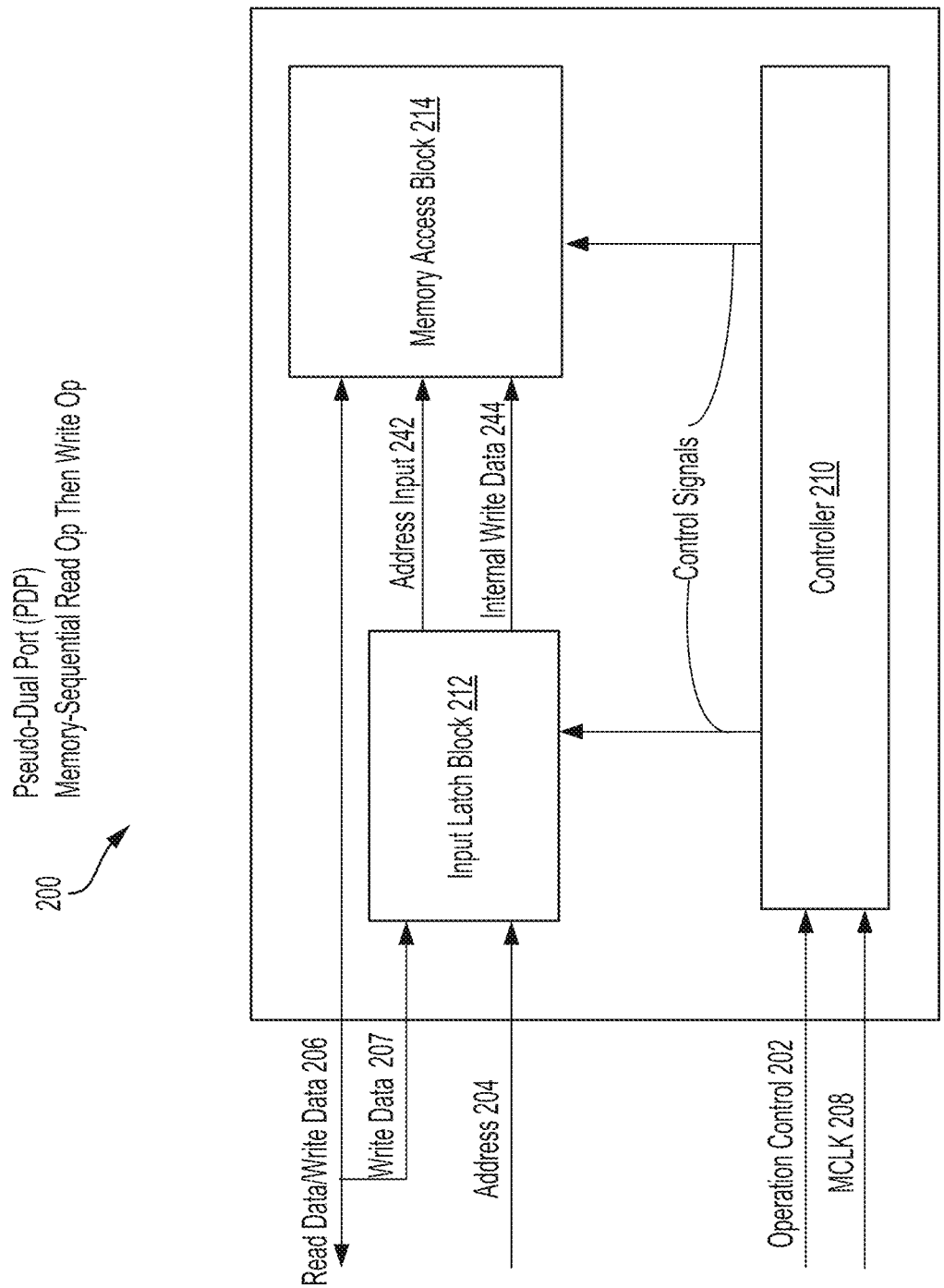
FIG. 2 is a block diagram of a pseudo-dual port (PDP) memory, in accordance with aspects of the present disclosure.

FIG. 2 is a block diagram of a configuration of a memory 200, as pseudo-dual port (PDP) memory, such as the memory 118 shown in FIG. 1. The memory 200 provides a medium for peripheral circuits (e.g., external to the memory 200) to write and read data (e.g., program instructions and data operated by the instruction). As described herein, the term "data" is understood to include program instructions, data, and any other information that may be stored in the memory 200. In one configuration, the memory 200 may be arranged as a PDP memory, operable to sequentially execute a read operation and then a write operation. The memory 200 includes an input latch block 212, a memory access block 214, and a controller 210. Although shown as an input latch 212, it should be recognized that the input latch 212 may be any type of sequential element.

The input latch block 212 interfaces and latches an address 204 and outputs an address input 242 to the memory access block 214 (e.g., as the read address and/or the write address to access the memory 200). The input latch block 212 may, in addition, receive and latch write data 207 (e.g., from read data/write data 206). The latched write data 207 may be provided to the memory access block 214 as the internal write data 244. The memory access block 214 decodes the address input 242 to access the memory cells for read and write operations. The memory access block 214 outputs read data on the read data/write data 206.

The controller 210 receives an operation control 202 and a master clock MCLK 208 to control the operations of the memory 200. The controller 210, based on the operation control 202, provides various control signals to the input latch block 212 and the memory access block 214 to direct the memory 200 to operate in various operating modes. For example, the memory 200 may perform read, write, or various testing operations as directed by the controller 210. The master clock MCLK 208 initiates the control signals to operate the memory operations.

The controller 210 and the portions of the controller 210 presented herein may be presented in terms of the functions and signals generated by the controller 210. The functions and signal generation may be implemented using electronic hardware (e.g., logic gates and circuits), computer software, or any combination thereof. Whether such elements are implemented as hardware or software depends upon the particular application and design constraints imposed on the overall system.

Figure 3:
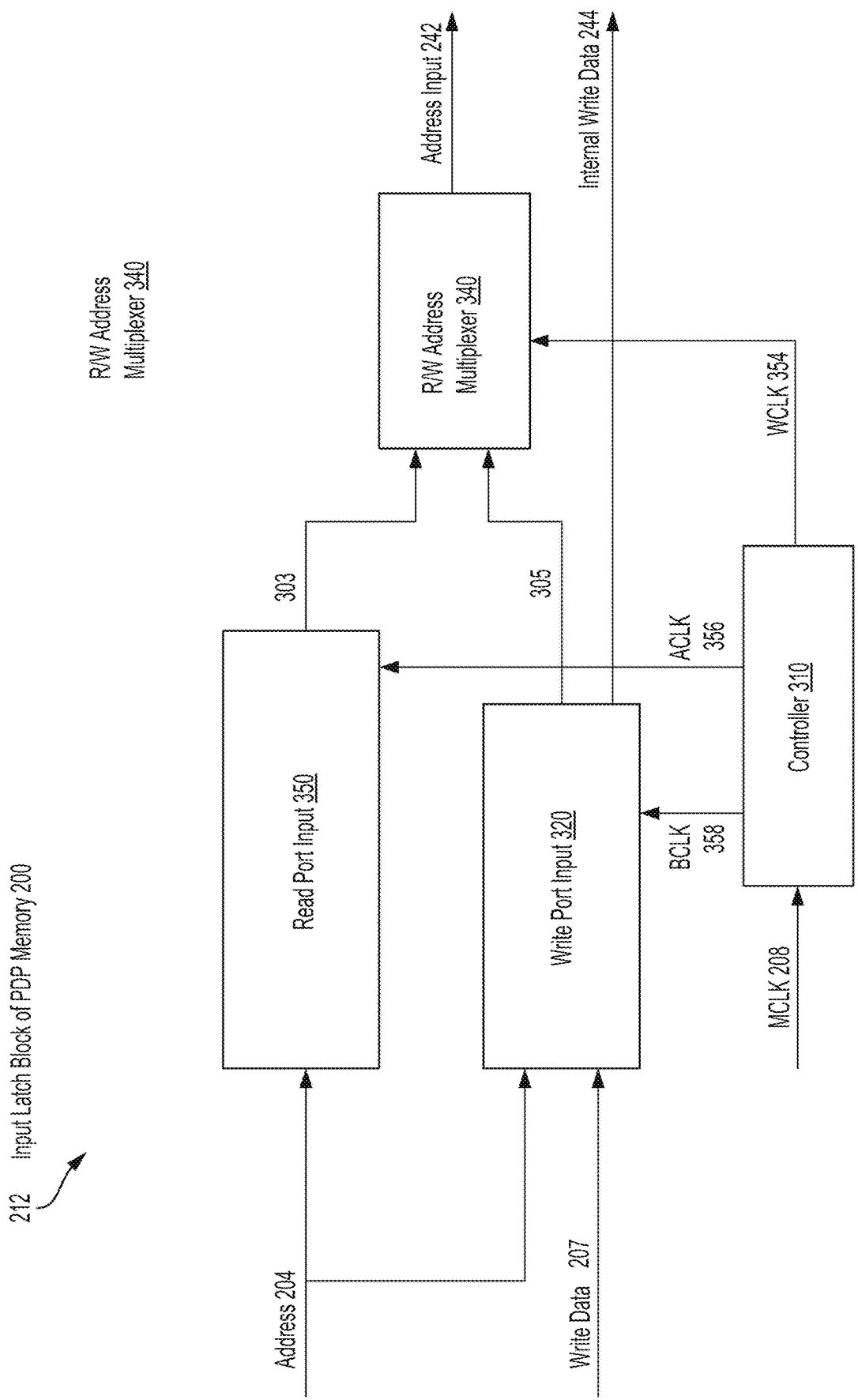
FIG. 3 is a block diagram of an input latch block of the pseudo-dual port (PDP) memory of FIG. 2, in accordance with aspects of the present disclosure.

FIG. 3 is a block diagram of the input latch block 212 of the memory 200 of FIG. 2. The input latch block 212 includes a read port input circuit 350 configured to receive and latch the address 204 and a write port input circuit 320 configured to receive and latch the address 204 and the write data 207 (from the read data/write data 206). A portion of the controller 210 (e.g., controller portion 310) receives the master clock MCLK 208, which initiates the memory access cycle. The controller portion 310 may include logic to perform the functions described herein, processor(s) performing the functions, logic gates generating the signals described herein, or combinations thereof. In one example, the memory 200 may perform a read memory access and then a write memory access in one access cycle set forth by the MCLK 208. Based on the MCLK 208, the controller portion 310 generates a clock signal ACLK 356, which enables the read port input circuit 350 to receive and latch the address 204 for the read operation, and a clock signal BCLK 358, which enables the write port input circuit 320 to receive and latch the address 204 and the write data 207 for the write operation.

The read port input circuit 350 outputs the received address 204 as an internal read address 303. The write port input circuit 320 outputs the received address 204 as an internal write address 305 and the received write data 207 as the internal write data 244. The internal read address 303 (stored by the read port input circuit 350) and the internal write address 305 (stored by the write port input circuit 320) are provided to a read/write (R/W) address multiplexer 340. The controller portion 310 generates a clock WCLK 354 for the R/W address multiplexer 340 to select among the internal read address 303 and the internal write address 305 (for the read operation and the write operation, respectively). The selected address is output as the address input 242 to the memory access block 214 of the memory 200. Likewise, the internal write data 244 is provided to the memory access block 214 of the memory 200 as selected by the clock WCLK 354. That is, the controller portion 310 generates the clock WCLK 354 to switch between the read address to the write address for the memory access.

The memory 200 may be any suitable memory technology, such as, by way of example, an SRAM. Nevertheless, as those skilled in the art readily appreciate, the memory 200 is not necessarily limited to SRAM. An SRAM includes an array of storage elements known as "cells," "memory cells," or "bitcells." Each memory cell is configured to store one bit of data (e.g., a logic 1 or a logic 0). FIG. 3 is a circuit diagram of a memory cell configuration of the memory 200 of FIG. 2.

Figure 4:
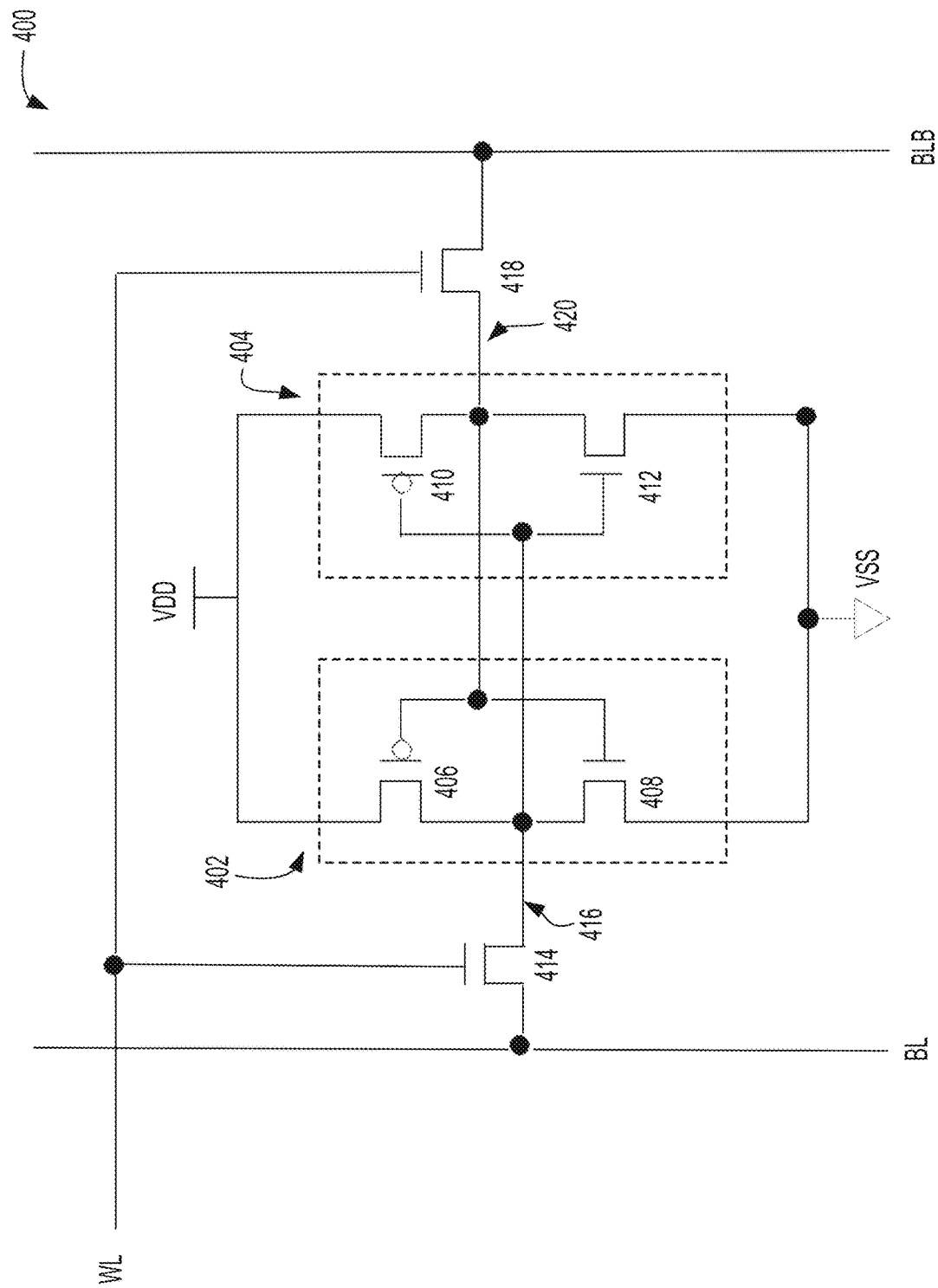
FIG. 4 is a block diagram of a configuration of a memory cell of the pseudo-dual port (PDP) memory of FIG. 2, in accordance with aspects of the present disclosure.

FIG. 4 is a circuit diagram of a configuration of the memory cells 400 of the memory 200 of FIG. 2, in accordance with aspects of the present disclosure. In this example, the memory cells 400 are implemented with a six-transistor (6T) configuration. Nevertheless, as those skilled in the art readily appreciate, the memory cells 400 may be implemented with a four-transistor (4T) or any other suitable transistor configuration.

The memory cells 400 are shown with cross-coupled inverters 402, 404. A first inverter 402 includes a p-channel transistor 406 and an n-channel transistor 408. A second inverter 404 includes a p-channel transistor 410 and an n-channel transistor 412. In the described configuration, the cross-coupled inverters 402, 404 are powered by a supply voltage rail (e.g., VDD) and have a ground voltage rail VSS (e.g., return). The cross-coupled inverters 402, 404 are interconnected to form a cross-coupled latch. A first n-channel access transistor 414 couples the output node 416 from the first inverter 402 to a bitline BL, and a second n-channel access transistor 418 couples the output node 420 from the second inverter 404 to a bitline BLB (e.g., the value of which is the opposite or inverse of the bitline BL). The gates of the first n-channel access transistor 414 and the second n-channel access transistor 418 are coupled to a wordline WL.

Figure 5:
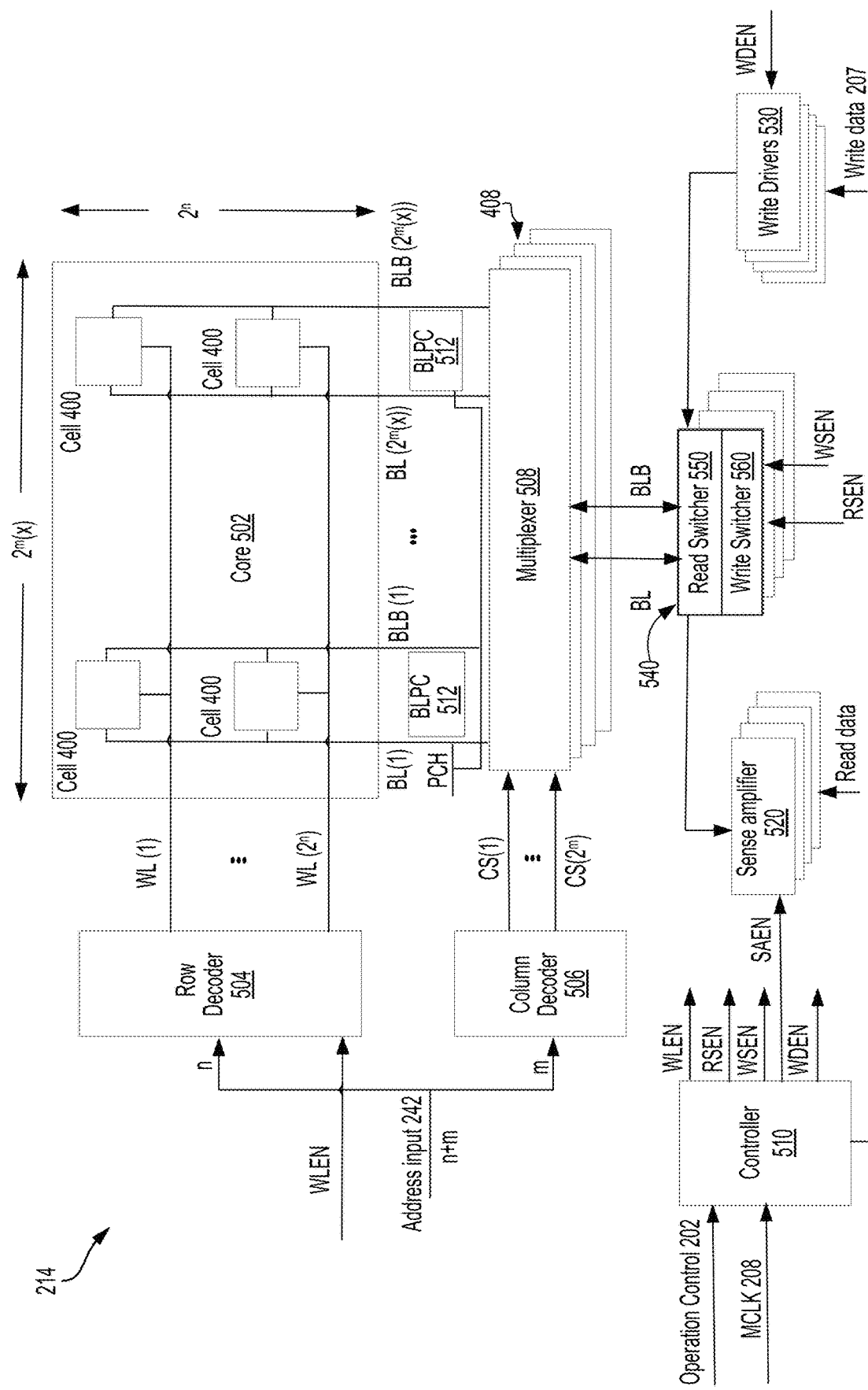
FIG. 5 is a block diagram of a configuration of a memory access block of the pseudo-dual port (PDP) memory of FIG. 2, in accordance with aspects of the present disclosure.
Figure 6:
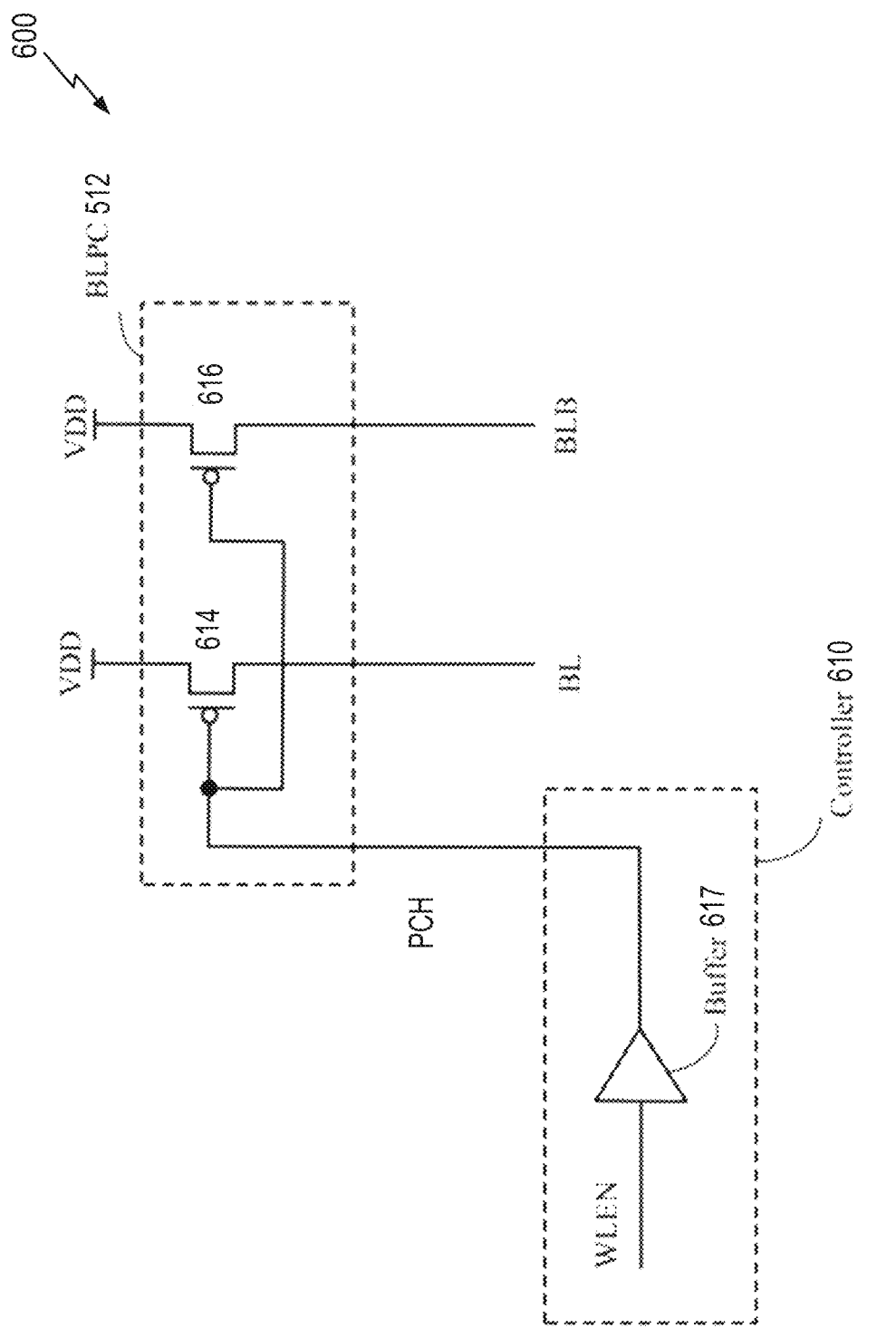
FIG. 6 is a circuit diagram of a configuration of a bitline pre-charge circuit and a controller portion, in accordance with aspects of the present disclosure.

A read operation may be initiated by pre-charging or charging the bitlines BL and BLB to a predetermined level, which is determined so as not to disturb the stored data in the memory cells 400. In some examples, a bitline pre-charge circuit (BLPC), as shown in FIGS. 5 and 6, pre-charges or pulls up the bitlines BL and BLB to a predetermined level that does not flip the stored data. The predetermined level may be a high level or VDD (e.g., a supply voltage (Vdd) level). In some examples, the predetermined level may be a portion (e.g., half) of VDD.

Once pre-charge of the bitlines BL and BLB is achieved, the wordline WL is asserted, connecting the cross-coupled inverters 402, 404 (e.g., cross-coupled) to the bitlines BL and BLB via the first n-channel access transistor 414 and the second n-channel access transistor 418, respectively. By way of example, the memory cells 400 may store the logic 1 by storing a low level (e.g., ground) at the output node 416 and a high level (e.g., VDD) at the output node 420. The states are maintained by the cross-coupled inverters 402, 404. Upon asserting the wordline WL, the first inverter 402 discharges the bitline BL through the first n-channel access transistor 414 and the output node 416. The bitline BLB is maintained at the high level by the second inverter 404 through the second n-channel access transistor 418 and the output node 420. A voltage difference on the bitline pair BL and BLB is established by the pulling-down of the bitline BL.

The bitlines BL and BLB are fed to a sense amplifier (SA), which senses the data (e.g., voltage difference or differential voltage) carried thereon and outputs a logic level (e.g., logic 1) as the read data to the peripheral circuit external to the memory 200. Various types of SAs known in the art may be utilized for the memory 200.

A write operation may be initiated by setting the bitlines BL and BLB to the value to be written to the memory cells 400 and asserting the wordline WL. That is, the internal write data 244 are driven onto the bitlines BL and BLB. The wordline WL may be asserted before or after the value to be written (e.g., internal write data 244) is provided to the bitlines BL and BLB. By way of example, a logic 1 may be written to the memory cells 400 by setting the bitline BL to a logic level 0 and the bitline BLB to a logic 1. The logic level 0 at the bitline BL is applied to the input of the second inverter 404 through the first n-channel access transistor 414, which in turn forces the output node 420 of the second inverter 404 to VDD. The output node 420 of the second inverter 404 is applied to the input of the first inverter 402, which in turn forces the output node 416 of the first inverter 402 to VSS. A logic level 0 may be written to the memory cells 400 by inverting the values of the bitlines BL and BLB. The write driver is designed to be stronger than the pull-up transistors (e.g., 406 and 410) in the memory cells 400 so that the internal write data 244 can override the previous state of the cross-coupled inverters 402, 404.

Once the read or write operation is complete, the wordline is de-asserted, thereby causing the first n-channel access transistor 414 and the second n-channel access transistor 418 to disconnect the bitlines BL and BLB from the cross-coupled inverters 402, 404. The cross-coupling between the cross-coupled inverters 402, 404 maintains the state of the inverter outputs as long as power is applied to the memory cells 400.

FIG. 5 is a block diagram of a configuration of the memory access block 214 of the memory 200 of FIG. 2, according to aspects of the present disclosure. The memory access block 214 includes a core 502 with supporting circuitry to decode addresses and to perform read and write operations. The core 502 includes memory cells 400 arranged to share connections in horizontal rows and vertical columns. Specifically, each horizontal row of the memory cells 400 shares a wordline WL. In addition, each vertical column of memory cells 400 shares a pair of bitlines BL and BLB. The size of the core 502 (e.g., the number of cells) may vary depending on a variety of factors, including the specific application, the speed specifications, the layout and testing specifications, and the overall design constraints imposed on the system. The core 502 may contain thousands or millions of memory cells 400.

In one implementation, the core 502 is made up of ($2^n \times 2^m$(x)) memory cells 400 arranged in $2^n$ horizontal rows and $2^m$(x) vertical columns, where $2^m$ is the number of words per row and x is the number of bits in each word output for a read access. A peripheral device (not shown) may randomly access any word (e.g., x cells) in the core 502 using an address that is (n+m) bits wide. In other words, the memory 200 outputs x-bits of read data for a read operation, and writes x-bits of data (e.g., internal write data 244) into the core 502 for a write operation.

The memory access block 214 receives the address input 242 of (e.g., n+m) bits from the input latch block 212 (shown in FIG. 2). The address input 242 may include an n-bit row address and an m-bit column address. In the memory access block 214, n-bits of the address are provided to the input of a row decoder 504 and m-bits of the address are provided to the input of a column decoder 506. The row decoder 504 converts the n-bit address into $2^n$ wordline outputs. A different wordline WL is asserted by the row decoder 504 for each different n-bit row address. As a result, each of the $2^m$(x) memory cells 400 in the horizontal row with the asserted wordline WL is connected to one pair of the $2^m$(x) bitlines BL and BLB through the first n-channel access transistor 414 and the second n-channel access transistor 418 as described above in connection with FIG. 4. The data stored in the memory cells are provided to the BL_RD and BLB_RD bitline pairs through the selected pairs of bitlines BL and BLB and the x multiplexers 508 with the asserted wordline WL, as described with FIG. 4. The BL_RD and BLB_RD bitline pairs (e.g., bitline read pair) are provided to the SAs 520 for amplification, and the resulting data of the amplification are output as read data.

In some examples, the row decoder 504 may be enabled or disabled (e.g., timed) by the signal WLEN (e.g., wordline enable). When the WLEN signal is de-asserted, the row decoder 504 does not assert any wordline. In this fashion, the WLEN signal may control a period and timing of asserting a wordline WL.

For column decoding, the memory access block 214 provides m bits of address to the column decoder 506. The column decoder 506 provides 2m outputs column selects (CS(1)-CS(2m)) with a different one of the outputs asserted for each different combination of the address input 242. The outputs are provided to x multiplexers 508. For example, the multiplexers 508 may include pass gates. Each multiplexer may be a 2m:1 multiplexer and selects one of 2m bitline pairs read from the memory array (e.g., core 502) based on the outputs from the column decoder 506. With x multiplexers 508, x bits are selected and outputted for each read access. Thus, for each memory access, x-bit of data are read from or written into the core 502. In some examples, the multiplexers 508 may be viewed as a 2m:1 selector. The selected x bitline pairs are outputted to sense amplifiers (SAs) 520 as bitline pairs BL and BLB.

In this configuration, each of the BL and BLB bitline pairs are coupled to a bitline pre-charge circuit (BLPC) 512, as further described below in FIG. 6. The BL and BLB bitline pairs are also coupled to SAs 520 and write drivers 530 via a read/write switcher 540, including a read switcher 550 and a write switcher 560. A read switcher enable (RSEN) signal controls the read switcher 550, and a write switcher enable (WSEN) signal controls the write switcher 560. During a read operation, the RSEN signal is asserted, and the WSEN signal is de-asserted. In response, the read switcher 550 couples the BL and BLB bitline pairs to the SAs 520. A sense amplifier enable (SAEN) signal, when asserted, enables the SAs 520 to read out the data on the bitline pairs BL and BLB as read data (e.g., the read data/write data 206).

Upon switching to the write operation, the RSEN signal is de-asserted, and the WSEN signal is asserted. In response, the write switcher 560 couples the bitline pairs BL and BLB to the write drivers 530. A write driver enable (WDEN) signal, when asserted, enables the write drivers 530 to write the internal write data 244 into the BL and BLB bitline pairs.

A controller portion 510 receives the operation control 202 (e.g., to indicate a read or write operation) and the MCLK 208. The controller portion 510 may generate the signals WLEN, RSEN, WSEN, SAEN, and WDEN as presented above using known schemes and circuits. For example, a dummy wordline may be included and relied upon to time the asserting of the WLEN signal. A dummy bitline may be included and relied upon to time the asserting of the SAEN signal.

FIG. 6 is a circuit diagram 600 of a configuration of the BLPC 512 and a controller portion 610. The circuit diagram 600 includes the BLPC 512 and the controller portion 610, in accordance with one aspect of the present disclosure. The BLPC 512 is configured to pre-charge or pull-up the bitline pair BL and BLB when the wordlines WL are de-asserted (e.g., when the memory 200 is not in a read or write operation). In one implementation, the BLPC 512 are configured to charge all of the bitline pairs BL and BLB coupled to the core 502 (shown in FIG. 5). According to aspects of the present disclosure, a BLPC 912 is configured to pre-charge unselected columns of a write operation (see FIG. 9). The BLPC 512 includes p-type transistors 614 and 616 controlled by the pre-charge signal PCH.

The controller portion 610 receives the WLEN signal and, in response, outputs a PCH signal. The controller portion 610 may de-assert the WLEN signal (e.g., pull to low level) to de-assert the wordlines WL upon a completion of a read operation. The controller portion 610 includes a buffer 617. The buffer 617 receives the WLEN signal and outputs the PCH signal to the BLPC 512. Pre-charge of the bitline pair BL and BLB is performed in response to the controller portion 610 de-asserting the WLEN signal. In response, the PCH signal is asserted (e.g., pulled to low level) to turn on the p-type transistors 614 and 616 to pre-charge the bitline pair BL and BLB. It should be recognized that activation of circuits may be based on an active low configuration (e.g., pulled to low level) or an active high configuration (e.g., pulled to high level).

Figure 7:
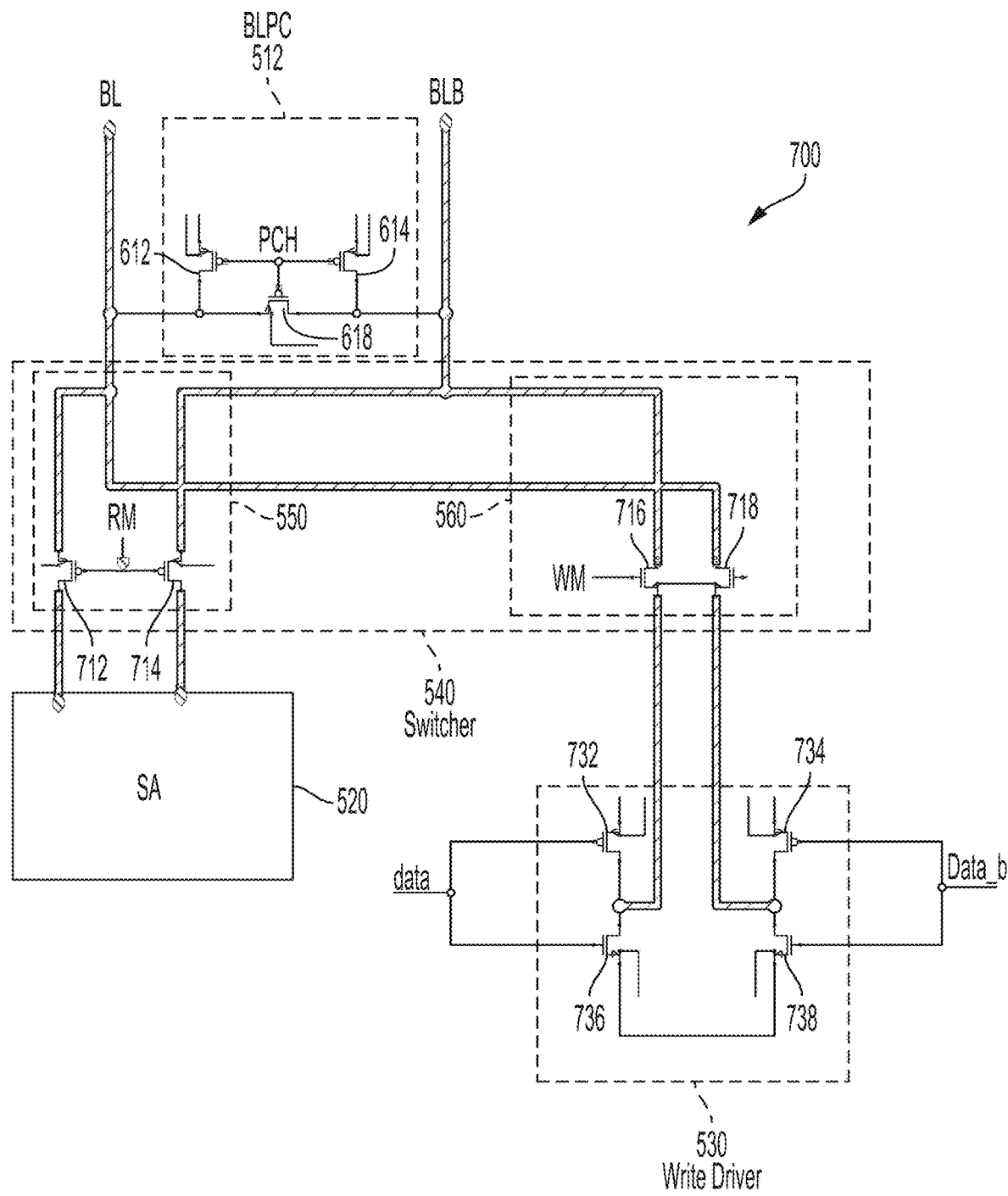
FIG. 7 is a circuit diagram of a configuration of a read/write switcher and associated sense amplifier and write driver, in accordance with aspects of the present disclosure.

FIG. 7 is a circuit diagram 700 of a configuration of a read/write switcher and associated sense amplifier and write driver, in accordance with aspects of the present disclosure. The circuit diagram 700 illustrates the read/write switcher 540, the BLPC 512, the SAs 520, and the write drivers 530 of FIG. 5. The BLPC 512 is modified from the configuration shown in FIG. 6 to include a p-type transistor 618 having a gate coupled to the gates of the p-type transistors 612 and 614 and coupled between drains of the p-type transistors 612 and 614. The read/write switcher 540 provides a way to switch the memory cells (not shown) coupled to the SAs 520 and to the write drivers 530.

In one configuration, the read switcher 550 includes p-type transistors 712 and 714 coupling the bitline pair BL and BLB (which is coupled to the memory cells 400) to the SAs 520. The write switcher 560 includes n-type transistors 716 and 718 coupling the bitline pair BL and BLB (which is coupled to the memory cells 400) to the write drivers 530. When the p-type transistors 712 and 714 are turned on to couple the SAs 520 to the bitline pair BL and BLB, the SAs 520 may sense the read data stored in the memory cells 400 (e.g., via the bitline pair BL and BLB). The n-type transistors 716 and 718 are turned off to decouple the write drivers 530 from the bitline pair BL and BLB. When the n-type transistors 716 and 718 are turned on to couple the write drivers 530 to the bitline pair BL and BLB, the write drivers 530 may write the internal write data 244 into the memory cells 400. The p-type transistors 712 and 714 are turned off to decouple the SAs 520 from the bitline pair BL and BLB.

In this configuration, the write drivers 530 includes pull-up p-type transistors 732 and 734 and pull-down n-type transistors 736 and 738. A drain of the pull-up p-type transistors 732 and 734 is coupled to a drain of the pull-down n-type transistors 736 and 738. The bitline BL is coupled to the drains of the pull-up p-type transistor 732 and the pull-down n-type transistor 736, which receive data at a gate. Similarly, the bitline bar BLB is coupled to the drains of the pull-up p-type transistor 734 and the pull-down n-type transistor 738, which receive data bar (data b) at a gate.

As described above, the read switcher 550 and the write switcher 560 are controlled to selectively couple the bitline pair BL and BLB to the SAs 520 or the write drivers 530 via the bitline pair BL and BLB. The SAs 520 may be implemented with schemes known in the art. The read operation and the write operation via the circuits of FIGS. 5-7 are presented in reference to FIG. 8 below.

Figure 8:
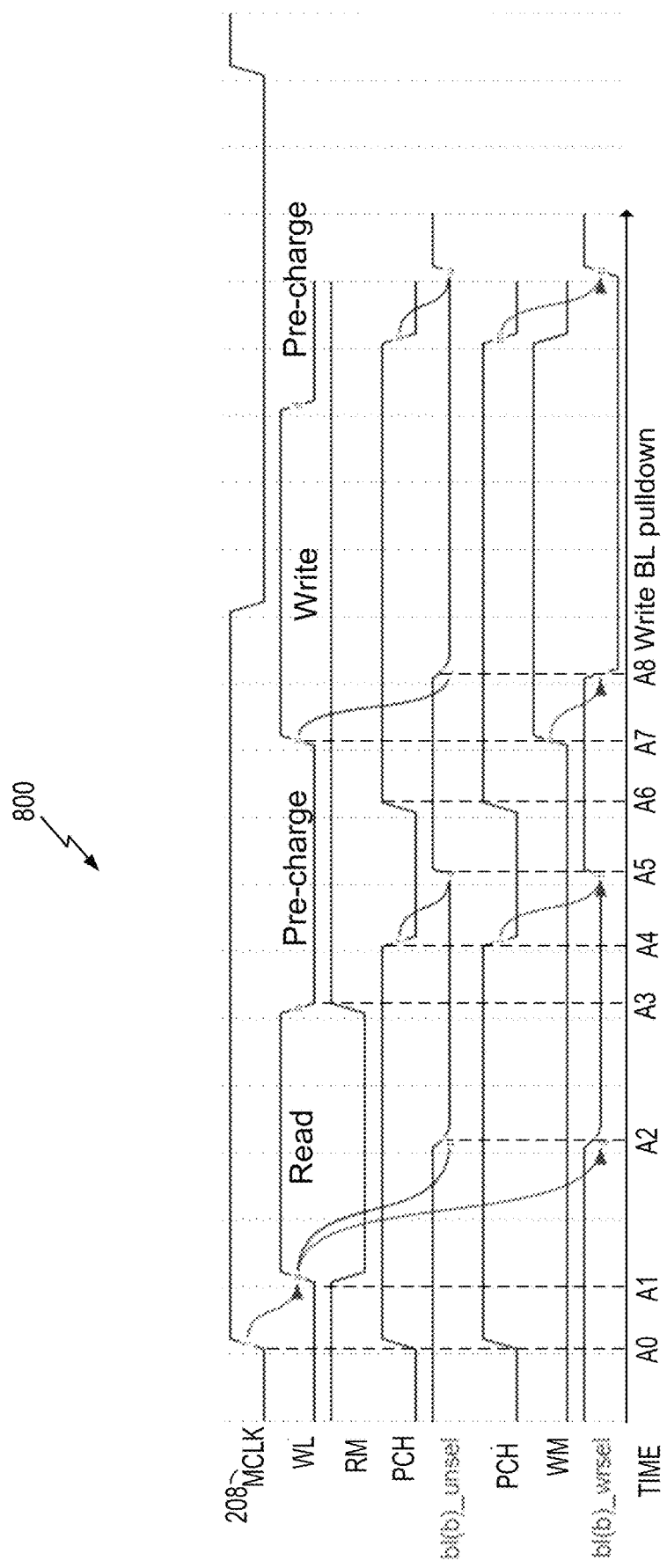
FIG. 8 is a diagram of waveforms of a read operation followed by a write operation for a configuration of a pseudo-dual port (PDP) memory, such as the memory shown in FIG. 2, in accordance with aspects of the present disclosure.

FIG. 8 is a diagram 800 of waveforms of a read operation followed by a write operation for a configuration of a pseudo-dual port (PDP) memory, such as the memory 200 shown in FIG. 2. The diagram 800 may be the waveforms operated by the circuits of FIGS. 5-7. The memory 200 receives the master clock MCLK 208 to initialize the read and write operations. In one implementation, the memory 200 may enact a read operation followed by a pre-charge operation followed by a write operation followed by a pre-charge operation within one cycle of the MCLK 208. In this example, the wordline WL signal is configured as an internal clock, in which the various phases (e.g., a read phase, a first pre-charge phase, a write phase, and a second pre-charge phase) of the WL signal are used to coordinate the noted memory operations within one cycle of the MCLK 208.

In an initial state (e.g., before the MCLK 208 is asserted), the WL signal is de-asserted (e.g., pulled to low level—active high configuration), and the pre-charge signal PCH is asserted (pulled to low level—active low configuration) to enable the BLPC 512 to pre-charge or pull-up the bitline pair BL and BLB to VDD (see FIG. 6). The controller 210 asserts the WLEN signal (e.g., pulled to high level—active high configuration) in response to the assertion of the MCLK 208. At time A0, the PCH signal is de-asserted (e.g., pulled to high level—active low configuration) following the asserted WLEN signal (see, FIG. 6). In response, the BLPC 512 stops pre-charging the bitline pair BL and BLB.

At time A1, the wordline WL is asserted (e.g., pulled to a high level) following assertion of the MCLK 208. In addition, at time A1, a read multiplexer (RM) signal is asserted by pulling the RM signal to a low level. In this example, the memory 200 is configured as an interleaved memory, in which multiple words are interleaved into one physical row of the memory 200. The RM signal connects the bitline pair BL and BLB to the SAs 520 (see FIG. 7). At time A2, the controller 210 activates the SAs 520 to read the bitline pair BL and BLB, as shown in FIG. 5. The controller 210 may de-assert the WL signal and de-assert the RM signal upon a completion of the read operation at time A3.

Following de-asserting of the WL signal and the RM signal, at time A4, the PCH signal is asserted (e.g., pulled low-active low configuration). In response, the BLPC 512 pre-charges or pulls high the bitline pair BL and BLB, at time A5, by pulling up an unselected bitline pair BL and BLB (e.g., bl(b)_unsel signal line) and the write selected bitline pair BL and BLB (bl(b)_wrsel signal). At time A6, the PCH signal is de-asserted (e.g., pulled to high level—active low configuration). Subsequent to the time A6, the WL signal is asserted (e.g., pulled to high level—active high configuration) for the write operation (following the read operation) at time A7. In addition, a write multiplexer (WM) signal is asserted (e.g., pulled to high level—active high configuration) at time A7. In response, at time A8, the bl(b) wrsel signal is pulled down to perform the write operation. At time A8, the controller 210 connects the write selected bitline pair BL and BLB to the write drivers 530 (see, FIG. 7). The controller 210 may then activate the write drivers 530. The write drivers 530 drives the internal write data 244 into the memory cells 400 (via the bitline pair BL and BLB and the multiplexers 508).

Unfortunately, the time to assert the WM signal (at time A7) follows the bitline pre-charge time A4-A6. The bitline pre-charge time A4-A6 may thus be part of the turnaround time for the memory 200 to transition to the write operation. However, the time A4-A7 (for sequential performance of the bitline pre-charge operation followed by the start of the write driver operation) may degrade the cycle time of the memory 200. Thus, reducing the read/write operation turnaround time of A3-A7 may be advantageous.

According to one aspect of the present disclosure, a bitline pre-charge operation overlaps with a write driver operation to improve the read/write operation turnaround time of the memory 200. That is, delaying the write bitline pair BL and BLB until after the pre-charge phase is complete is avoided by overlapping these operations. Improving the turnaround time beneficially reduces the overall cycle time of the memory 200.

Figure 9:
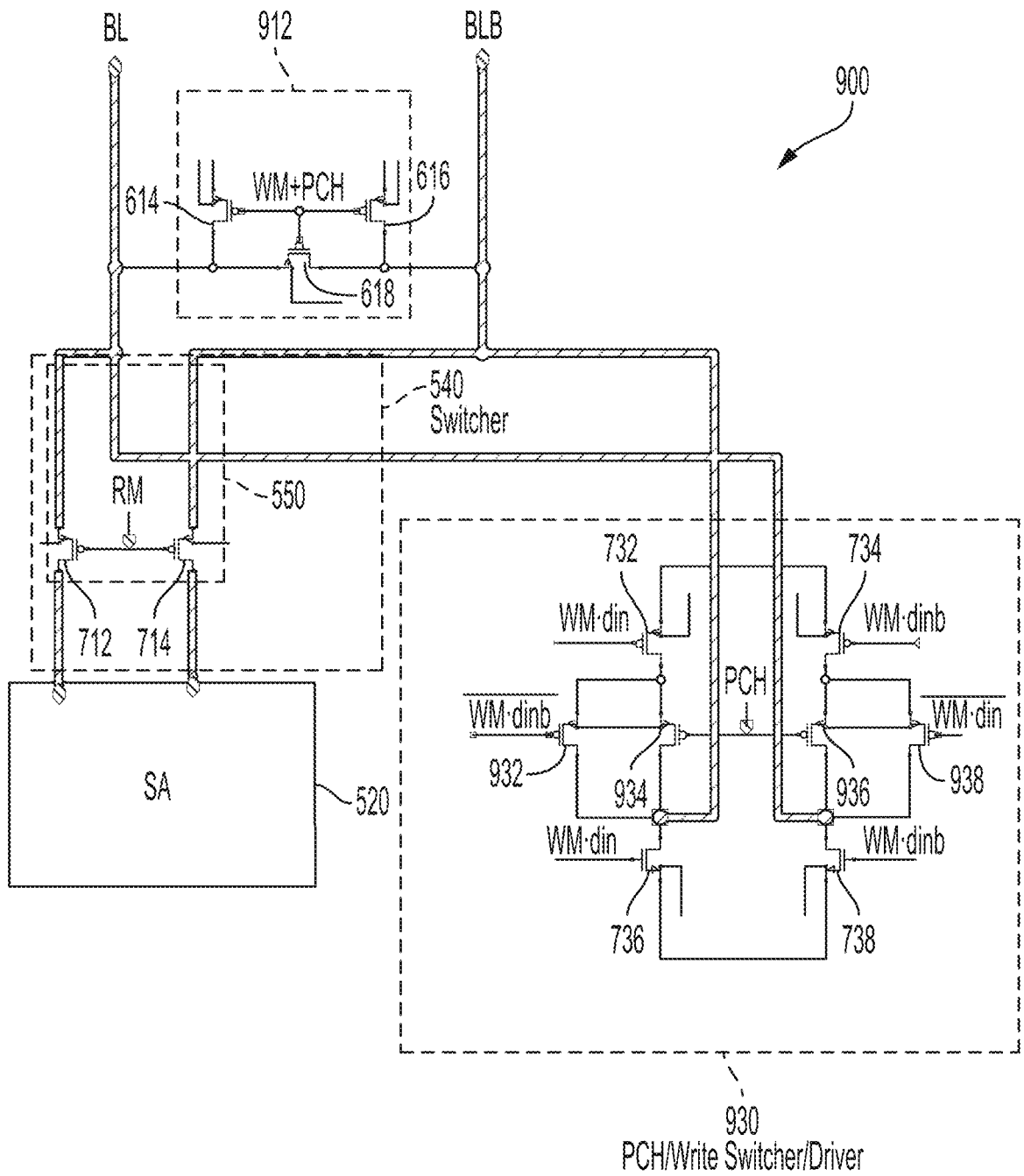
FIG. 9 is a circuit diagram of a configuration of a merged pre-charge/write switcher/driver, in accordance with aspects of the present disclosure.

FIG. 9 is a circuit diagram 900 of a configuration of a merged pre-charge/write switcher/driver, in accordance with aspects of the present disclosure. The circuit diagram 900 illustrates the read switcher 550 and the SAs 520, as shown in FIG. 7. In this aspect of the present disclosure, the write drivers 530 of FIG. 7 are merged with the write switcher 560. The write drivers 530 are modified to perform pre-charge (PCH) functionality of a merged pre-charge/write switcher/driver circuit 930. In this configuration, the write drivers 530 are modified to include a PCH/write switcher functionality coupled between drains of the pull-up p-type transistors 732 and 734 and pull-down n-type transistors 736 and 738.

In this aspect of the present disclosure, the PCH/write switcher functionality is provided by first p-type transistors 932 and 934 coupled to the bitline BL and second p-type transistors 936 and 938 coupled to the bitline BLB. In this configuration, first p-type transistors 932 and 934 are coupled in parallel, and the second p-type transistors 936 and 938 are also are coupled in parallel. In the configuration shown in FIG. 9 the symbol "·" is used to represent a logical AND combination of a write mux (WM) signal and a data input (din) or complementary data input (dinb) signal for differential data (e.g., WM·din, WM·dinb). The symbol "+" is used to represent a logical OR combination of a write mux (WM) signal and the pre-charge (PCH) signal (e.g., WM+PCH).

In addition, a complement write mux and input data differential signal ($\overline{WM \cdot dinb}$) and a complement write mux and input data differential signal ($\overline{WM \cdot din}$) are supplied to gates of the first p-type transistor 932 and the second p-type transistor 938. In addition, gates of the first p-type transistor 934 and the second p-type transistor 936 are supplied with the pre-charge signal (PCH). In this aspect of the present disclosure, a BLPC 912 is modified from the configuration shown in FIG. 6 to receive a merged write mux (WM) pre-charge (PCH) signal (WM+PCH) at gates of the p-type transistors 614, 616 and the p-type transistor 618.

In operation, the WM+PCH signal is asserted (e.g., active low) only for the unselected columns of a write operation ("wire unselected columns"). As a result, the BLPC 912 pre-charges the bitline pair BL and BLB for the write unselected columns, which will undergo a read operation during a write phase. The WM+PCH signal is de-asserted for the write select columns (e.g., the columns selected by a write operation). When write masking is not selected, the WM·din and WM·dinb signals are high/low (complimentary in nature depending on the data to be written) for the selected column(s). This results in pulling the bitline BL or bitline bar BLB low (e.g., using 736/738) from B4 to end of write (write wordline falling), as shown in FIG. 10.

In this example, the complimentary node (e.g., BLB/BL) is pulled high (e.g., using 734+936/732+934 during B4 to B7) when the PCH signal is a global pre-charge signal, which is asserted (e.g., through 734+938/732+932 during B4) until the end of write. As a result, the bitline pair BL and BLB are driven to appropriate write data value by the merged pre-charge/write switcher/driver circuit 930. By contrast, when write masking for a particular write column is specified, transistors (e.g., 736/734) are turned off and so are other transistors (e.g., 932/938). By extension, transistors (e.g., 732/734) are also turned on. Thus, when the global PCH signal is low (e.g., from B4 to B6), both of the bitline pair BL and BLB are pre-charged high and the bitline pair BL and BLB are left flowing when the PCH signal is deasserted at B6. Thus enabling read operation on the write column that is specified for masking.

As described above, the read switcher 550 and the merged pre-charge/write switcher/driver circuit 930 are controlled to selectively couple the bitline pair BL and BLB to the SAs 520 or the merged pre-charge/write switcher/driver circuit 930. This configuration of the merged pre-charge/write switcher/driver circuit 930 enables merging of a pre-charge operation and a write bitline pull-down, which avoids waiting for the bitline to develop, as shown in FIG. 7. In addition, the bitline pair BL and BLB are actively pulled-up to VDD, rather than incurring a VDD minus a threshold voltage (Vt) drop across the configuration of the write drivers 530 shown in FIG. 7. Furthermore, the bitline pair BL and BLB float during a bit/byte write mask, such that no active drive is performed to improve memory yield. In addition, the additional paths provided by merged pre-charge/write switcher/driver circuit 930 improve the pre-charge time after write (e.g., when bitlines are fully discharged) by increasing a number of pre-charge paths. The read operation and the write operation via the circuits of FIGS. 5 and 9 are presented in reference to FIG. 10 below.

Figure 10:
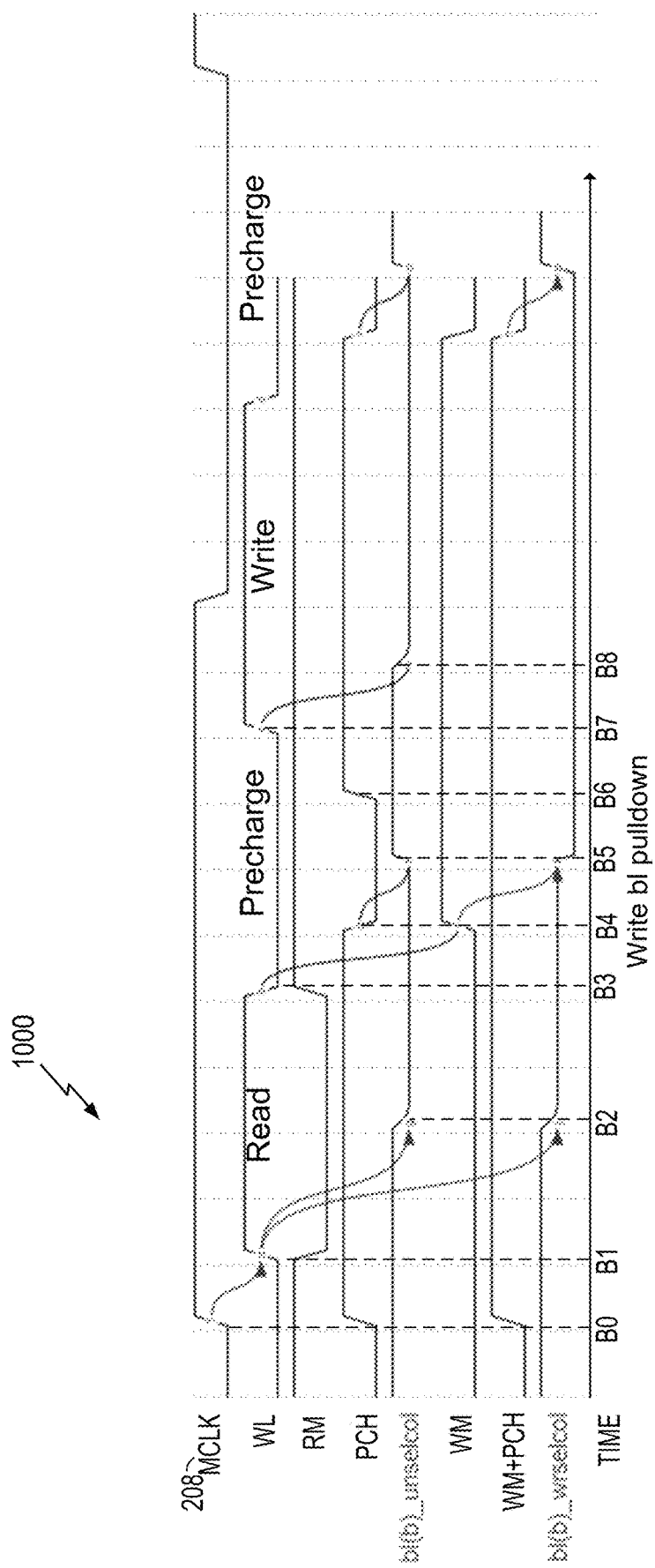
FIG. 10 is a diagram of waveforms of a read operation followed by a write operation for a configuration of a pseudo-dual port (PDP) memory, including the merged pre-charge/write switcher/driver of FIG. 9, according to aspects of the present disclosure.

FIG. 10 is a diagram 1000 of waveforms of a read operation followed by a write operation for a configuration of a pseudo-dual port (PDP) memory, including the merged pre-charge/write switcher/driver circuit 930 shown in FIG. 9, according to aspects of the present disclosure. The diagram 1000 may be the waveforms operated by the circuits of FIGS. 5 and 9. Similar to the diagram 800 of FIG. 8, the memory 200 also receives the master clock MCLK 208 to initialize the read and write operations. The read operation is followed by a pre-charge operation, which is followed by a write operation, which is followed by a pre-charge operation, collectively performed within one cycle of the MCLK 208. In this example, the wordline WL signal is configured as an internal clock, including a read phase, a first pre-charge phase, a write phase, and a second pre-charge phase of the WL signal to coordinate the noted memory operations within one cycle of the MCLK 208.

In this aspect of the present disclosure, at time B0, the PCH signal and the merged WM+PCH signal are de-asserted (e.g., pulled to high level—active low configuration) concurrently with asserting of the MCLK 208 (e.g., pulled to high level—active high configuration). At time B1, the wordline WL is asserted (e.g., pulled to a high level—active high configuration) following assertion of the MCLK 208. In addition, at time B1, the read multiplexer (RM) signal is de-asserted by pulling the RM signal to a low level to support the interleaved configuration of the memory 200. At time B2, the controller 210 activates the SAs 520 to read the bitline pair BL and BLB, as shown in FIG. 5. The controller 210 may de-assert the WL signal and assert the RM signal upon completing the read operation at time B3.

Following de-asserting of the WL signal and the RM signal, at time B4, the PCH signal is asserted (e.g., pulled low-active low configuration), while the merged WM+PCH remains de-asserted. In response, the BLPC 912 pre-charges or pulls high the bitline pair BL and BLB, at time B5, by pulling up unselected columns of bitline pair BL and BLB (bl(b)_unselcol signal line). In contrast to the configuration shown in FIG. 8, the WM signal (e.g., WM·din) is asserted (e.g., pulled high—active high configuration) at time B4 and the write selected column bitline pair BL or BLB is pulled down to perform the write operation prior to de-asserting the PCH signal (e.g., pulled to high level—active low configuration) at time B6. Subsequent to the time B6, the WL signal is asserted (e.g., pulled to high level—active high configuration) for the write operation (following the read operation) at time B7.

Beneficially, the time to assert the WM signal (at time B4) is concurrent with asserting the PCH signal. In response, pull-down of the signal at time B7 avoids the bitline pre-charge time A4-A6 shown in FIG. 8. The bitline pre-charge time A4-A6 for transition of the memory 200 to the write operation in FIG. 8 is avoided to decrease the cycle time of the memory 200. Thus, the read/write operation turnaround time is reduced (e.g., by greater than 15%) using the merged pre-charge/write switcher/driver circuit 930 shown in FIG. 9.

According to this aspect of the present disclosure, the bitline pre-charge operation (e.g., time B4-B6) overlaps with the write driver operation at time B5 to improve the read/write operation turnaround time of the memory 200. That is, delaying pull-down of the write bitline pair BL and BLB until after the pre-charge phase is complete is avoided by overlapping these operations. Improving the turnaround time beneficially reduces the overall cycle time of the memory 200 (e.g., by greater than 15%).

Figure 11:
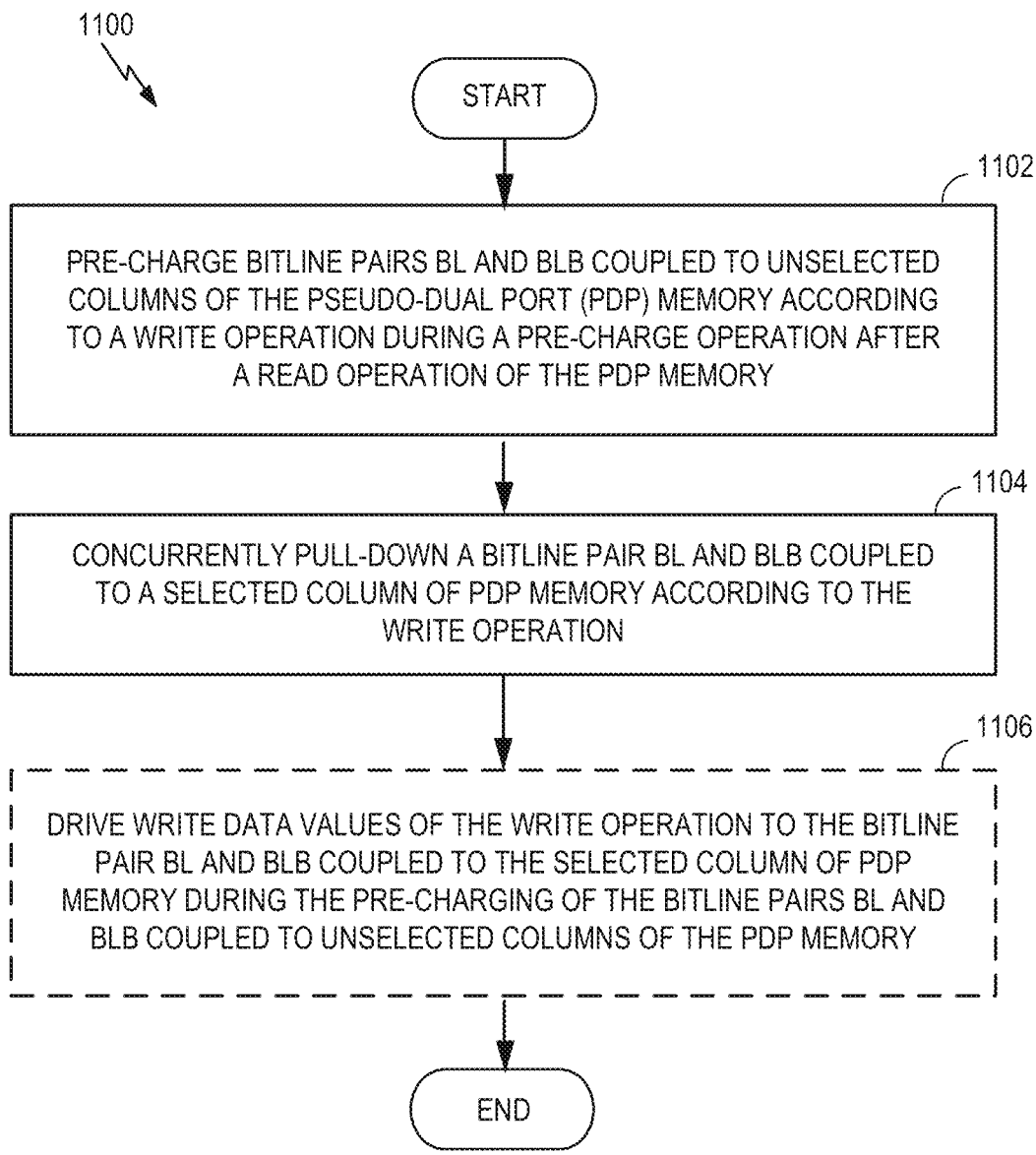
FIG. 11 is a flow diagram illustrating a method for operating a pseudo-dual port (PDP) memory, according to aspects of the disclosure.

FIG. 11 is a flow diagram illustrating a method for operating a pseudo-dual port (PDP) memory, according to aspects of the disclosure. A method 1100 begins at block 1102, in which bitline pairs BL and BLB coupled to unselected columns of the PDP memory, according to a write operation, are pre-charged during a pre-charge operation after a read operation of the PDP memory. For example, as shown in FIG. 10, at time B5, pulling up of unselected columns of bitline pair BL and BLB (bl(b)_unselcol signal) is performed to pre-charge the bitline pair BL and BLB coupled to unselected columns, as determined by the write operation.

Referring again to FIG. 11, at block 1104, a bitline pair BL and BLB coupled to a selected column of PDP memory, according to the write operation, are concurrently pulled-down. For example, in FIG. 10, the WM signal is asserted (e.g., pulled high—active high configuration) at time B5 and the write selected column bitline pair BL and BLB (bl(b)_wrselcol signal) is pulled down to initiate the write operation prior to the de-asserting the PCH signal (e.g., pulled to high level—active low configuration) at time B6, At optional block 1106, write data values of the write operation are driven to the bitline pair BL and BLB coupled to the selected column of PDP memory during the pre-charging of the bitline pairs BL and BLB coupled to unselected columns of the PDP memory. As shown in FIG. 10, the WL signal is asserted (e.g., pulled to high level) for the write operation (following the read operation) at time B7. In response, at time B8, pre-charge of the bl(b) unsel signal terminates.

According to aspects of the present disclosure, a pseudo dual-port (PDP) memory is described. The PDP memory includes means for pre-charging bitline pairs BL and BLB coupled to unselected columns of the PDP memory according to a write operation during a pre-charge operation after a read operation of the PDP memory. The means for pre-charging may, for example, include the BLPC circuit 912 and the merged pre-charge/write switcher/driver circuit 930, as shown in FIG. 9. The PDP memory may also include means for concurrently pulling-down a bitline pair BL and BLB coupled to a selected column of PDP memory according to the write operation. The means for pulling-down may, for example, include the merged pre-charge/write switcher/driver circuit 930 of FIG. 9. In another aspect, the aforementioned means may be any layer, module, or any apparatus configured to perform the functions recited by the aforementioned means.

Figure 12:
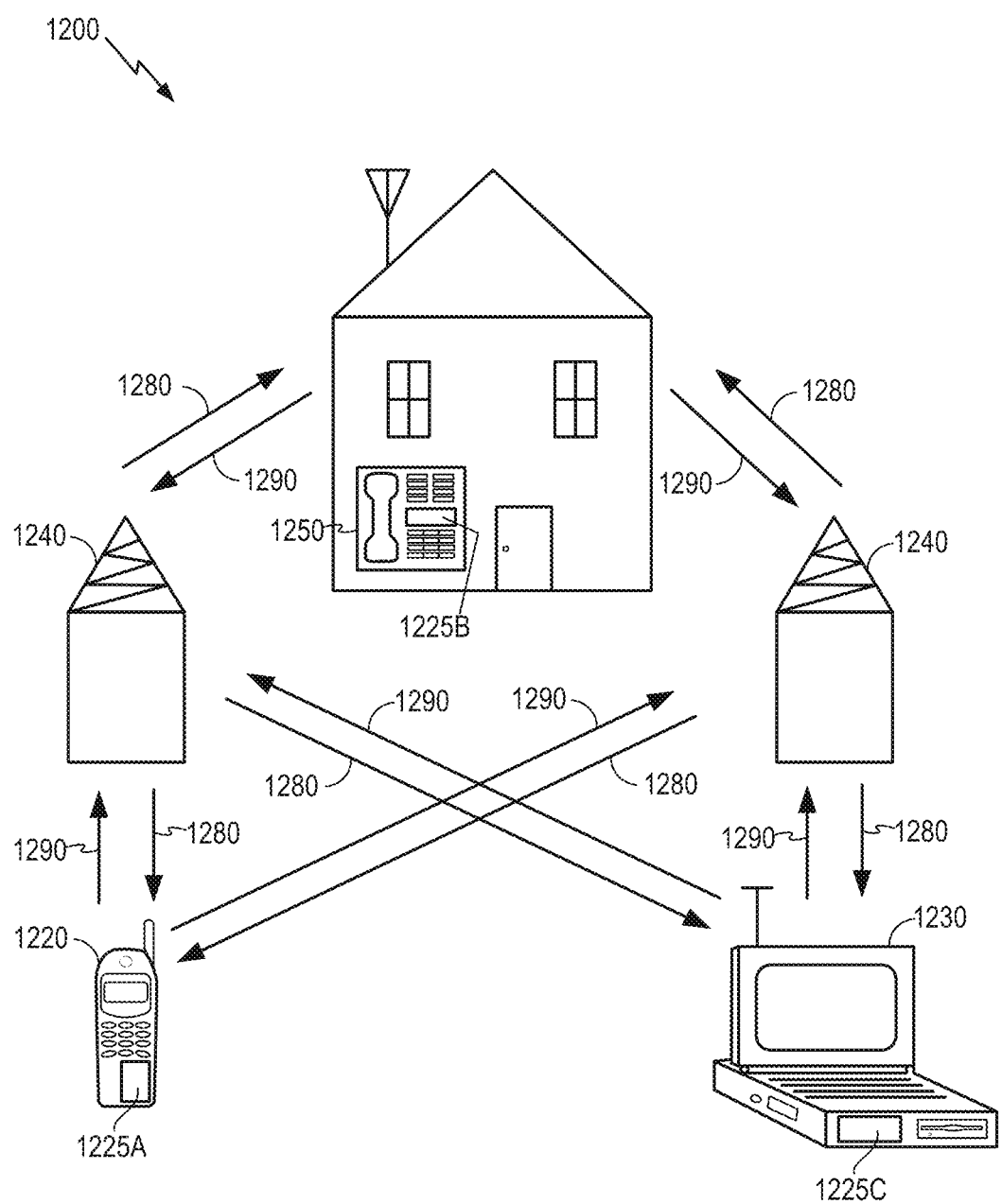
FIG. 12 is a block diagram showing a wireless communications system in which a configuration of the disclosure may be advantageously employed.

FIG. 12 is a block diagram showing an exemplary wireless communications system 1200 in which a configuration of the disclosure may be advantageously employed. For purposes of illustration, FIG. 12 shows three remote units 1220, 1230, and 1250 and two base stations 1240. It will be recognized that wireless communications systems may have many more remote units and base stations. Remote units 1220, 1230, and 1250 include IC devices 1225A, 1225B, and 1225C, which include the disclosed PDP memory. It will be recognized that any device containing an IC may also include the disclosed PDP memory, including the base stations, switching devices, and network equipment. FIG. 12 shows forward link signals 1280 from the base station 1240 to the remote units 1220, 1230, and 1250, and reverse link signals 1290 from the remote units 1220, 1230, and 1250 to base stations 1240.

In FIG. 12, a remote unit 1220 is shown as a mobile telephone, a remote unit 1230 is shown as a portable computer, and a remote unit 1250 is shown as a fixed location remote unit in a wireless local loop system. For example, the remote units may be a mobile phone, a hand-held personal communications systems (PCS) unit, a portable data unit such as a personal data assistant, a GPS enabled device, a navigation device, a set top box, a music player, a video player, an entertainment unit, a fixed location data unit such as meter reading equipment, or any other device that stores or retrieves data or computer instructions, or any combination thereof. For example, a remote unit including the low power memory sub-system may be integrated within a vehicle control system, a server computing system or other like system specifying critical data integrity. Although FIG. 12 illustrates IC devices 1225A, 1225B, and 625C, which include the disclosed PDP memory, the disclosure is not limited to these exemplary illustrated units. Aspects of the present disclosure may be suitably employed in any device, which includes the PDP memory.

For a firmware and/or software implementation, the methodologies may be implemented with modules (e.g., procedures, functions, and so on) that perform the described functions. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a non-transitory computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communications media including any medium that facilitates transfer of a computer program from one place to another. A storage media may be any available media that can be accessed by a general-purpose or special-purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD) and Blu-ray disc, where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b, and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A method for operating a pseudo-dual port (PDP) memory, the method comprising:
   pre-charging bitline pairs BL and BLB coupled to unselected columns of the PDP memory according to a write operation during a pre-charge operation after a read operation of the PDP memory; and
   concurrently pulling-down a bitline pair BL and BLB coupled to a selected column of PDP memory according to the write operation.

2. The method of claim 1, further comprising driving write data values of the write operation to the bitline pair BL and BLB coupled to the selected column of PDP memory during pre-charging of the bitline pairs BL and BLB coupled to unselected columns of the PDP memory.

3. The method of claim 1, in which pre-charging of the bitline pairs BL and BLB comprising charging to a supply voltage (Vdd) level across the bitline pairs BL and BLB.

4. The method of claim 1, further comprising reducing a time of pre-charging of the bitline pairs BL and BLB.

5. The method of claim 4, further comprising asserting a write multiplexer (WM) signal concurrently with de-asserting of a pre-charge (PCH) signal.

6. The method of claim 1, further comprising:
   asserting a merged write multiplexer (WM) signal and a pre-charge (PCH) signal (WM+PCH) concurrently with asserting a pre-charge signal (PCH); and
   de-asserting the PCH signal prior to the de-asserting of the WM+PCH signal.

7. The method of claim 1, in which pre-charging of the bitline pairs BL and BLB comprising floating the bitline pairs BL and BLB when a write wordline is asserted during a mask write operation.

8. A pseudo dual port (PDP) memory, comprising:
   a sense amplifier coupled to bitline pairs BL and BLB;
   a bitline pre-charge (BLPC) circuit coupled to the bitline pairs BL and BLB;
   a read multiplexer coupled to the bitline pairs BL and BLB and between the sense amplifier and the BLPC circuit; and
   a merged pre-charge/write switcher/driver circuit coupled to the bitline pairs BL and BLB and configured to pre-charge the bitline pairs BL and BLB coupled to unselected columns of the PDP memory according to a write operation during a pre-charge operation after a read operation of the PDP memory and to concurrently pull-down a bitline pair BL and BLB coupled to a selected column of the PDP memory according to the write operation.

9. The PDP memory of claim 8, in which the merged pre-charge/write switcher/driver circuit is further configured to drive write data values of the write operation to the bitline pair BL and BLB coupled to the selected column of the PDP memory during the pre-charge of the bitline pairs BL and BLB coupled to unselected columns of the PDP memory.

10. The PDP memory of claim 8, in which the merged pre-charge/write switcher/driver circuit and the BLPC circuit are configured to pre-charge the bitline pairs BL and BLB by charging to a supply voltage (Vdd) level across the bitline pairs BL and BLB.

11. The PDP memory of claim 8, in which the merged pre-charge/write switcher/driver circuit and the BLPC circuit are configured to reduce a time of the pre-charging of the bitline pairs BL and BLB.

12. The PDP memory of claim 11, in which the merged pre-charge/write switcher/driver circuit is further configured to assert a write multiplexer signal WM concurrently with de-asserting of a pre-charge (PCH) signal.

13. The PDP memory of claim 8, in which the merged pre-charge/write switcher/driver circuit is further configured to float the bitline pairs BL and BLB when a write wordline is asserted during a mask write operation.

14. A non-transitory computer-readable medium having program code recorded thereon for operating a pseudo-dual port (PDP) memory, the program code being executed by a processor and comprising:
   program code to pre-charge bitline pairs BL and BLB coupled to unselected columns of the PDP memory according to a write operation during a pre-charge operation after a read operation of the PDP memory; and
   program code to concurrently pull-down a bitline pair BL and BLB coupled to a selected column of PDP memory according to the write operation.

15. The non-transitory computer-readable medium of claim 14, further comprising program code to drive write data values of the write operation to the bitline pair BL and BLB coupled to the selected column of PDP memory during the program code to pre-charge of the bitline pairs BL and BLB coupled to unselected columns of the PDP memory.

16. The non-transitory computer-readable medium of claim 14, in which the program code to the pre-charge the bitline pairs BL and BLB comprising program code to charge to a supply voltage (Vdd) level across the bitline pairs BL and BLB.

17. The non-transitory computer-readable medium of claim 14, further comprising program code to reduce a time of the pre-charging of the bitline pairs BL and BLB.

18. The non-transitory computer-readable medium of claim 17, further comprising program code to assert a write multiplexer (WM) signal concurrently with program code to de-assert a pre-charge (PCH) signal.

19. The non-transitory computer-readable medium of claim 14, further comprising:
   program code to assert a merged write multiplexer (WM) signal and a pre-charge (PCH) signal (WM+PCH) concurrently with program code to assert the PCH signal; and
   program code to de-assert the PCH signal prior to program code to de-assert the WM+PCH signal.

20. The non-transitory computer-readable medium of claim 14, in which the pre-charging of the bitline pairs BL and BLB comprising floating the bitline pairs BL and BLB when a write wordline is asserted during a mask write operation.

* * * * *